US007511233B2

(12) United States Patent
Pocrass

(10) Patent No.: US 7,511,233 B2
(45) Date of Patent: Mar. 31, 2009

(54) FLASH MEMORY DRIVE WITH INTEGRATED MALE AND FEMALE CONNECTORS

(76) Inventor: Alan L. Pocrass, 41 Golden Glen Drive, Simi Valley, CA (US) 93065

(*) Notice: Subject to any disclaimer, the term of this patent is extended or adjusted under 35 U.S.C. 154(b) by 26 days.

(21) Appl. No.: 11/028,382

(22) Filed: Jan. 3, 2005

(65) Prior Publication Data

US 2006/0028803 A1 Feb. 9, 2006

Related U.S. Application Data

(60) Provisional application No. 60/599,226, filed on Aug. 4, 2004.

(51) Int. Cl.
*H05K 7/02* (2006.01)

(52) U.S. Cl. ....................................... 174/541; 361/737

(58) Field of Classification Search ................. 361/737; 711/103, 115; 710/313, 62; 174/541
See application file for complete search history.

(56) References Cited

U.S. PATENT DOCUMENTS 5,242,310 A * 9/1993 Leung ....................... 439/76.1
5,499,162 A * 3/1996 Bartuska et al. ............. 361/737
D487,734 S 3/2004 Peng et al.
6,733,329 B2 5/2004 Yang
D498,737 S 11/2004 Park et al.
D498,754 S 11/2004 Blyth
2002/0169978 A1* 11/2002 Kim et al. ................... 713/200
2003/0233509 A1* 12/2003 Chang ........................ 710/316
2004/0193764 A1* 9/2004 Watanabe .................... 710/62
2005/0086413 A1* 4/2005 Lee et al. .................... 710/313
2005/0109841 A1* 5/2005 Ryan et al. .................. 235/380
2005/0278461 A1* 12/2005 Ohta ............................ 710/8

* cited by examiner

*Primary Examiner*—Hung V Ngo
(74) *Attorney, Agent, or Firm*—The Webb Law Firm

(57) ABSTRACT

The present invention is a flash memory drive including a printed circuit board, a male connector mounted to the printed circuit board, a female connector mounted to the printed circuit board, a flash memory chip mounted on the printed circuit board and electrically coupled to the male connector and the female connector and a download/copy logic chip for enabling data to be transferred to or from the flash memory chip. The female connector is configured to mate with another male connector for transferring data to or from the flash memory chip.

16 Claims, 6 Drawing Sheets

FLASH MEMORY DRIVE WITH INTEGRATED MALE AND FEMALE CONNECTORS

CROSS REFERENCE TO RELATED APPLICATIONS

This application claims the benefit of U.S. Provisional Application No. 60/599,226, filed Aug. 4, 2004, entitled "Flash Memory Drive with Integrated Male and Female USB Connector Device", the disclosure of which is hereby incorporated by reference.

BACKGROUND OF THE INVENTION

1. Field of the Invention

The present invention relates to a flash memory drive and, more particularly, to a flash memory drive with integrated male and female connectors.

2. Description of Related Art

Flash memory drives are typically non-mechanical devices that can currently hold from 8 megabytes to 1 gigabyte of data. A flash memory drive, such as a compact flash drive, connects to a computer via a Universal Serial Bus (USB) connector and can transfer data at rates of more than 1 MB per second. Current flash memory drives have male USB connectors that plug into female USB ports on a desktop computer, a laptop computer or a palm device. An advantage of a flash memory device is that it is small, portable, tough and has a large memory capacity. A typical flash memory drive is about the size and weight of a disposable lighter or a pack of gum. It can also be worn around a user's neck, attached to a key chain or easily fit into a handbag.

Currently flash memory devices do not include any means for transferring information between two flash memory devices without the use of a computer or a palm device. This limits the file sharing capabilities of such devices. Furthermore, the use of such devices limits the number of available USB ports on a computer that may be needed for printers, digital cameras, scanners and the like.

Accordingly, a need exists for a flash memory drive that can transfer data to another flash memory drive without the use of a computer. A further need exists for a flash memory drive that enables devices with male USB connectors to be plugged into the flash memory drive.

SUMMARY OF THE INVENTION

The present invention is a flash memory drive with integrated male and female connectors. The flash memory drive includes a printed circuit board, a male connector mounted to the printed circuit board, a female connector mounted to the printed circuit board and configured to mate with the male connector, a flash memory chip mounted on the printed circuit board and electrically coupled to the male connector and the female connector, and means for enabling data to be transferred to or from the flash memory chip. The female connector is configured to mate with another male connector for transferring data to or from the flash memory chip.

The flash memory drive can include a battery coupled to provide power to the flash memory chip, the means for enabling data to be transferred to or from the flash memory chip and/or a means for facilitating electrical connection of at least one of the male and female connector to at least one of a cable, another drive and a peripheral device. The flash memory drive can include a switch for causing the transfer of data to or from the flash memory chip, a master/slave switch for setting the drive to transfer data to or from the flash memory chip as a function of the setting of the master/slave switch and/or an LED for indicating that the transfer of data is in progress. An enclosure can be provided that surrounds the printed circuit board and provides protection for the components mounted thereon.

The flash memory drive can also include a digital audio chip for retrieving digital audio data from the flash memory chip, for decoding the digital audio data and for converting the decoded audio data to an analog audio signal. An output connector, such as a head phone jack, can be provided for outputting the analog audio signal to headphones or speakers, and buttons can be provided for controlling the digital audio chip. Buttons and switches are used interchangeably throughout the specification to indicate a means for manually activating a function of the flash memory drive.

The flash memory drive can also include a display screen, such as a liquid crystal display (LCD) or plasma screen, that provides information to the user such as, without limitation, the name of the song, the time remaining in the song, the status of the device, such as master or slave, and any other useful information.

The present invention is also a method of transferring information from a first flash memory drive having an integrated male connector to a second flash memory drive having an integrated female connector. The method includes inserting the male connector of the first flash memory drive into the female connector of the second flash memory drive, and transferring information from the first flash memory drive to the second flash memory drive, or vice versa.

Further details and advantages of the present invention will become apparent upon reading the following detailed description in conjunction with the accompanying drawings.

DETAILED DESCRIPTION OF THE INVENTION

The present invention will be described with reference to the accompanying figures where like reference numbers correspond to like elements.

Figure 1:
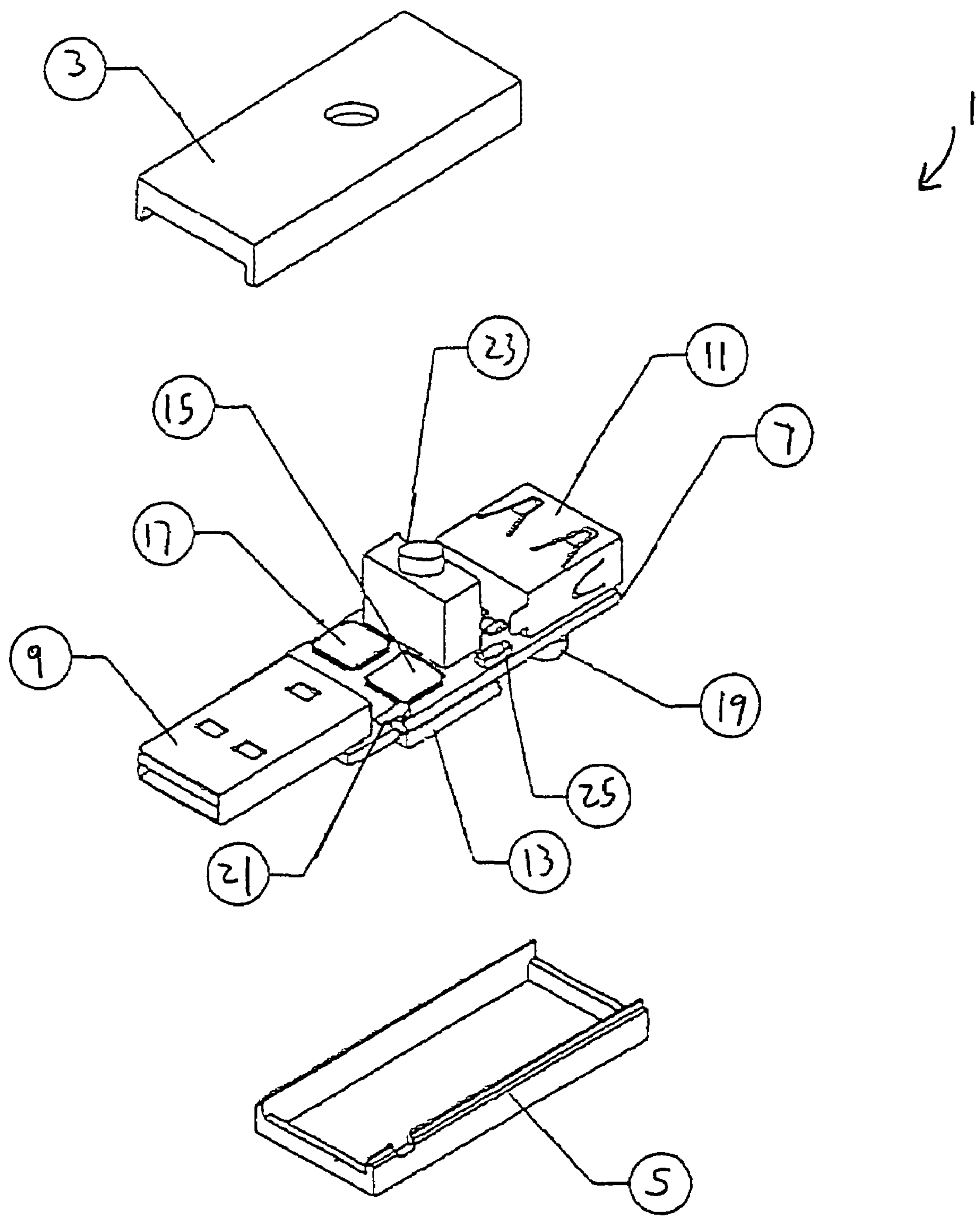
FIG. 1 is an exploded perspective view of a flash memory drive in accordance with a first embodiment of the present invention.
Figure 2:
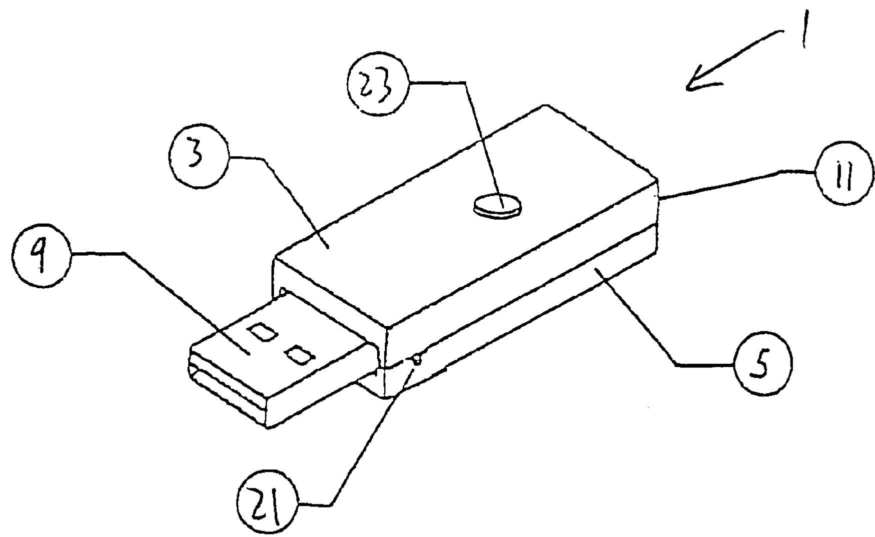
FIG. 2 is an assembled perspective view of the flash memory drive of FIG. 1.

With reference to FIGS. 1 and 2, a flash memory drive 1 includes a top cover 3, a bottom cover 5 and a printed circuit board 7.

Top cover 3 and bottom cover 5 can mate around printed circuit board 7 to form a protective housing. These covers can be made of a variety of materials, but are desirably made from, without limitation, plastic or metal.

Flash memory drive 1 further includes a male USB connector 9 and a female USB connector 11. Male USB connector 9 and female USB connector 11 are mounted on printed circuit board 7 by soldering, surface mount technology, press fitting or other means of mounting components on printed circuit boards known in the art. Male USB connector 9 is configured to mate with a female USB connector of a desktop computer, laptop computer, palm device, an interface cable, etc. Female USB connector 11 is configured to mate with a male USB connector of another flash memory drive. This other flash memory drive can either be a prior art flash memory drive or a flash memory drive in accordance with the present invention.

One or more flash memory chips 13, a download/copy logic chip 15, a hub logic chip 17 and a battery 19 can be mounted on printed circuit board 7 in a manner known in the art. Hereafter, it will be assumed that only one flash memory chip 13 is present. However, this is not to be construed as limiting the invention. Flash memory chip 13 is configured to store anywhere from 8 megabytes to 1 gigabyte of data. Download/copy logic chip 15, which is electrically connected to flash memory chip 13, facilitates the transfer of data stored therein to a flash memory chip of another flash memory drive, or vice versa. Hub logic chip 17 facilitates connection of one or both of male USB connector 10 and female USB connector 11 to a universal serial bus having connected thereto one or more other devices, such as, without limitation, a prior art flash memory drive, another flash memory drive in accordance with the present invention, a desktop computer, a laptop computer, a palm device, a printer, a digital camera, a scanner, and the like. Battery 19 provides power to flash memory chip 13, download/copy logic chip 15 and hub logic chip 17 when flash memory drive 1 is not attached to the USB port of an externally powered device, such as a computer, palm device, etc. Battery 19 enables the combination of flash memory chip 13, download/copy logic chip 15 and hub logic chip 17 to transfer data from flash memory chip 13 to the flash memory chip of another flash memory drive, or vice versa, attached to male USB connector 9 or female USB connector 11 without the use of such an externally powered device. A logic chip (not shown) can be electrically coupled to battery 19 to enable the charging of battery 19 when male USB connector 9 or female USB connector 11 of flash memory drive 1 is connected to an externally powered device. While battery 19 is used in the present embodiment, it is envisioned that flash memory drive 1 may also or alternatively include other power supplies, such as one or more solar cells that can be utilized to power chips 13, 15 and 17 and/or charge battery 19. While download/copy logic chip 15, hub logic chip 17 and the logic chip for enabling the battery to charge are described above as separate chips, it is envisioned that that the function of each of these chips could be incorporated into one or two chips. Accordingly, the number of chips described herein is not to be construed as limiting the invention.

Figure 3:
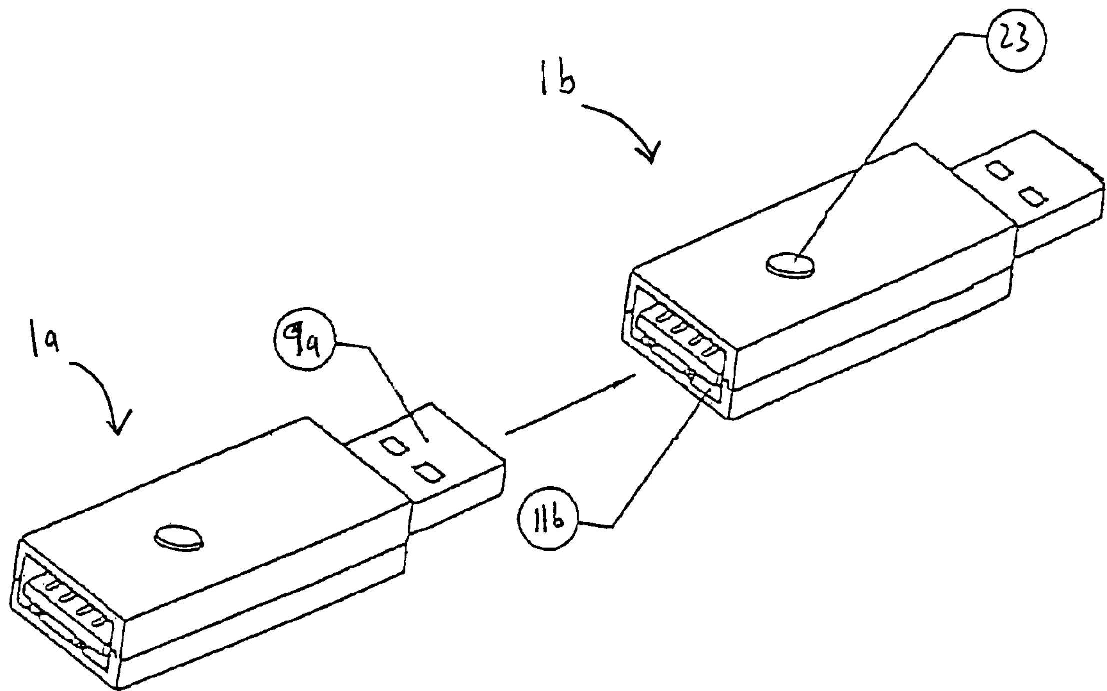
FIG. 3 is a perspective view of two first embodiment flash memory drives interacting.

With reference to FIG. 3 and with continuing reference to FIGS. 1 and 2, a first flash memory drive 1*a* and a second flash memory drive 1*b*, both in accordance with the present invention, can be joined together by inserting the male USB connector 9*a* of first flash memory drive 1*a* to the female USB connector 11*b* of a second flash memory drive 1*b* for the purpose of transferring or copying data from the flash memory chip of first flash memory drive 1*a* to the flash memory chip of second flash memory drive 1*b*, or vice versa.

Each flash memory drive 1 can include a master/slave switch 21 coupled to download/copy logic chip 15 for setting the flash memory drive as either a master or a slave. In operation, when first flash memory drive 1*a* and second flash memory drive 1*b* are joined together, the flash memory drive set to be the master transfers data from its flash memory chip to the flash memory chip of the flash memory drive set to be the slave. For example, first flash memory drive 1*a* can be set as the master and second flash memory drive 1*b* can be set as the slave using each flash memory drive's master/slave switch 21. Hence, when first flash memory drive 1*a* and second flash memory drive 1*b* are joined together data is transferred from the flash memory chip of first flash memory drive 1*a* to the flash memory chip of second flash memory drive 1*b*.

When flash memory drive 1 in accordance with the present invention is utilized with a conventional, prior art flash memory drive having only a male USB connector, the master/slave switch 21 of flash memory drive 1 can set flash memory drive 1 as the master for transferring data from the flash memory chip of flash memory drive 1 to the flash memory chip of the prior art flash memory drive. Alternatively, the master/slave switch 21 of flash memory drive 1 in accordance with the present invention can set flash memory drive 1 as the slave for transferring data from the flash memory chip of the prior art flash memory drive to the flash memory chip 13 of flash memory drive 1 in accordance with the present invention. Thus, it can be seen that flash memory drive 1 in accordance with the present invention can be used with other flash memory drives 1 in accordance with the present invention or with prior art flash memory drives.

Desirably, when male USB connector 9 is plugged into a female USB connector of a computer, a palm device, and the like, the transfer of data to or from flash memory chip 13 can be controlled via the device in a manner known in the art. Thus, desirably, it is only when the master/slave switch 21 sets flash memory drive 1 as the master that flash memory drive 1 is operative for controlling the transfer of data from its flash memory chip 13. This is in contrast to when master/slave switch 21 sets flash memory drive 1 as a slave, wherein flash memory drive 1 enables data to be transferred into its flash memory chip 13 under the control of another flash memory drive in accordance with the present invention, from a prior art flash memory drive or under the control of a computer, palm device, and the like.

A push button switch 23 can be provided on printed circuit board 7 and accessible via top cover 3 to allow for manual activation of the transfer of data between coupled flash memory drives. For example, in response to activation of push button switch 23 of first flash memory drive 1*a*, set as a master by master/slave switch 21, download/copy logic chip 15 of first flash memory drive 1*a* transfers data from the flash memory chip 13 of flash memory drive 1*a* to the flash memory chip 13 of either second flash memory drive 1*b* or a prior art flash memory drive (not shown) coupled to first flash memory drive 1*a*. However, the use of push button switch 23 is not to be construed as limiting the invention since it is envisioned that other control means can be utilized to cause the transfer of data between flash memory drives. For example, flash memory drive 1 can be responsive to the setting of master/slave switch 21 for transferring data to or from its flash memory chip when flash memory drive 1 is connected to another flash memory drive in accordance with the present invention or a prior art flash memory drive.

Each flash memory drive 1 can also include an optional light emitting diode (LED) 25 that is illuminated when data is being transferred therefrom to either another flash memory drive in accordance with the present invention or a prior art flash memory drive, or vice versa. LED 25 may be selected from any light emitting device suitable for such an application.

Figure 4:
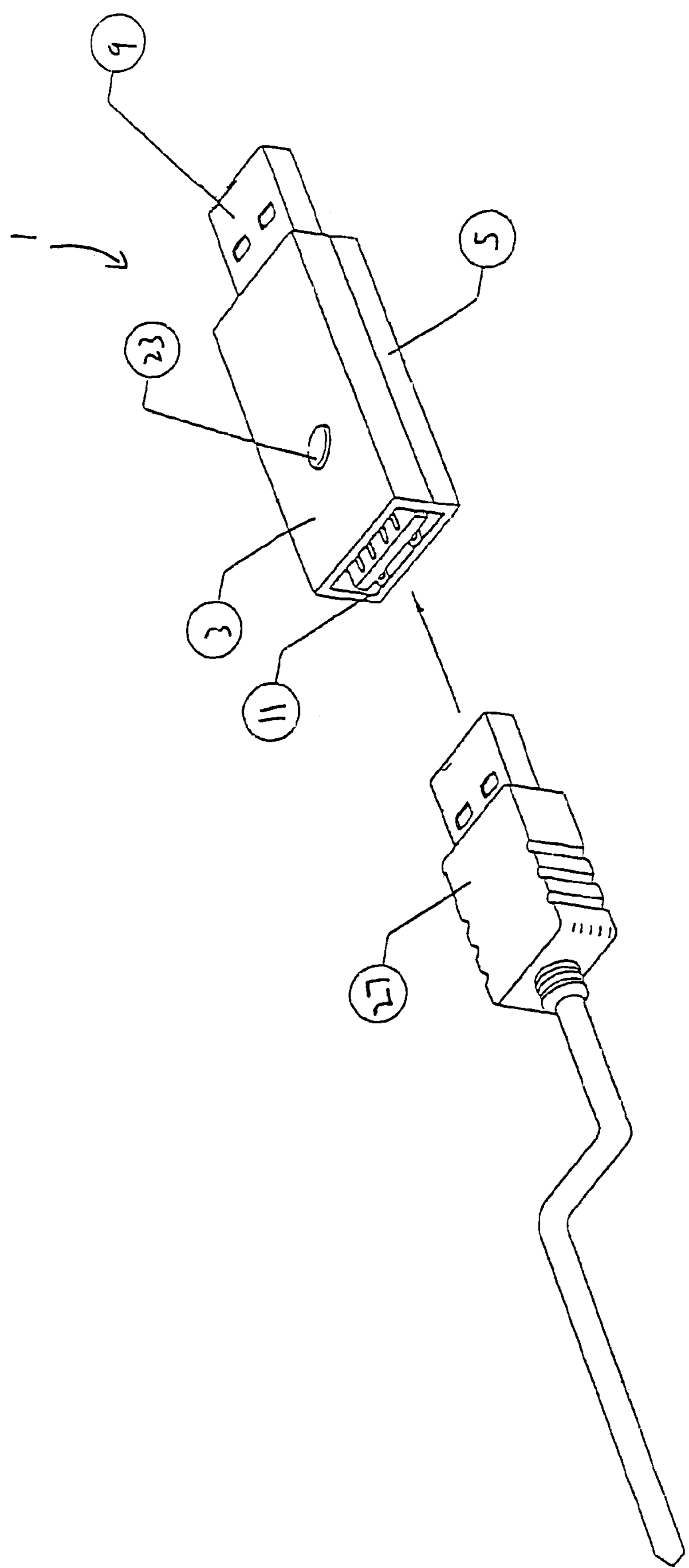
FIG. 4 is a perspective view of the first embodiment flash memory drive interacting with a USB cable having a male connector.

With reference to FIG. 4 and with continuing reference to FIGS. 1 and 2, flash memory drive 1 may also be used to maximize the available USB ports on a computer or palm device. Specifically, male USB connector 9 of flash memory drive 1 may be inserted into a USB port of a computer (not shown). Thereafter, female USB connector 11 can accept a male USB connector 27 of a USB cable. This enables peripheral devices, such as cameras, printers, scanners or additional flash memory drives, to utilize the same USB port on a computer as flash memory drive 1.

Figure 5A:
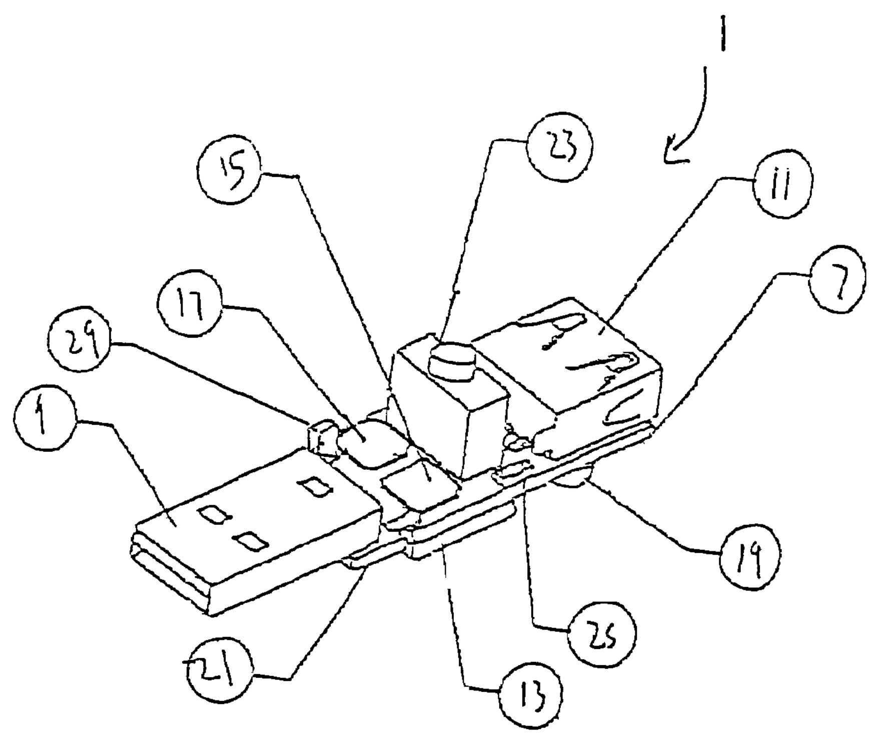
FIG. 5*a* is an exploded perspective view of a flash memory drive in accordance with a second embodiment of the present invention.
Figure 5B:
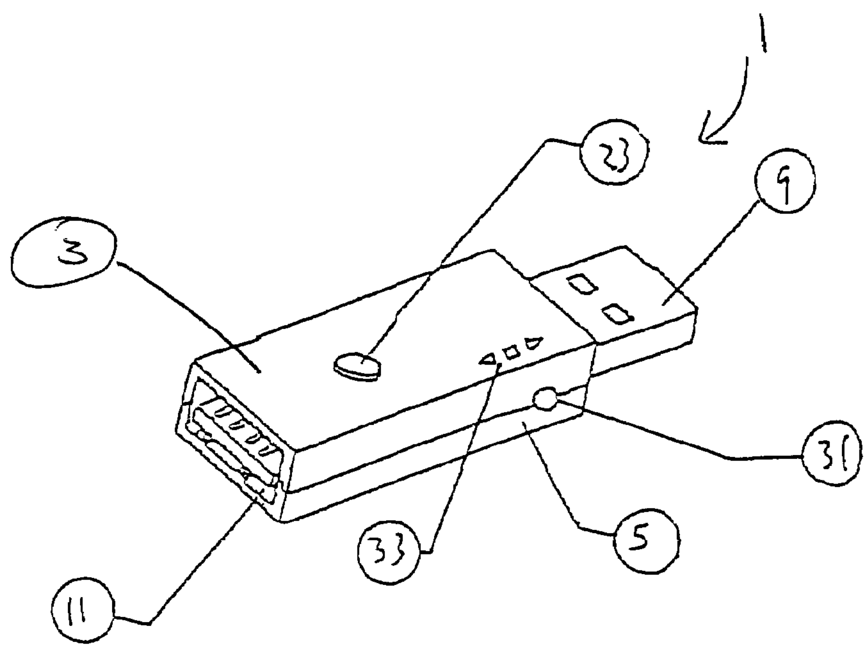
FIG. 5*b* is an assembled perspective view of the flash memory drive of FIG. 5*a;*

With reference to FIGS. 5*a* and 5*b*, a second embodiment of flash memory drive 1 includes a digital audio chip 29 and an output connector 31, such as a headphone jack. Digital audio chip 29 includes a digital signal processor (DSP), an amplifier and a digital-to-analog converter (DAC). The DSP can retrieve digital audio data from flash memory chip 13 and can decode said digital audio data utilizing a decompression algorithm, such as an mp3 or wma decompression algorithm, that undoes the compression of the digital audio data stored in a corresponding compressed format on flash memory chip 13. Then, the DAC converts the decompressed audio data back into an analog audio data. Finally, the amplifier boosts the strength of the signal and sends it to sound output connector 31. Buttons 33 can be provided on top cover 3 for controlling digital audio chip 29. Buttons 33 perform such functions as playing the digital audio data, stopping, pausing, skipping, rewinding and the like. While push button switch 23 is shown, the function provided by push button switch 23 can be incorporated into one or more buttons 33, whereupon push button switch 23 can be omitted from the embodiment shown in FIGS. 5*a* and 5*b*.

Figure 6:
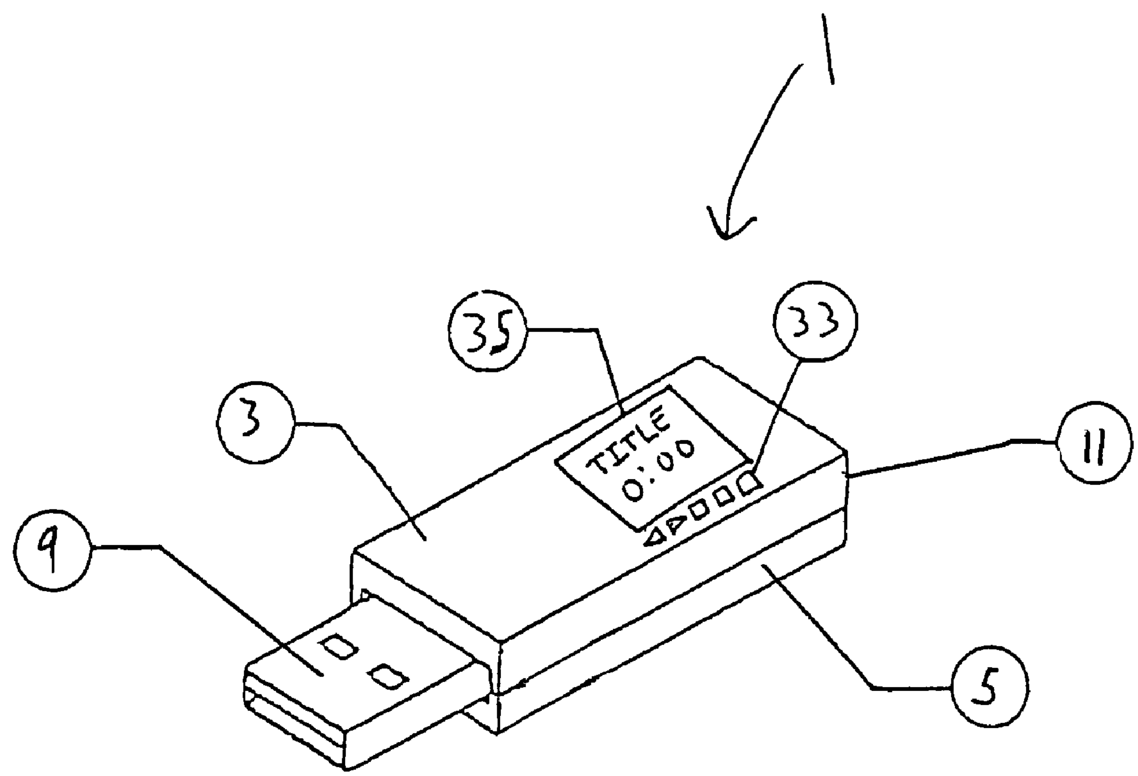
FIG. 6 is a perspective view of a flash memory device in accordance with a third embodiment of the present invention.

With reference to FIG. 6, a third embodiment a flash memory drive 1 includes a display screen 35 viewable via top cover 3. Display screen 35 can be connected to suitable circuitry mounted on printed circuit board 7 for providing a visual indication of the title of the digital audio data, the time remaining in a song and other useful and desirable information. This embodiment can replace push button 23 and/or master/slave switch 21 with buttons 33. Flash memory drive 1 can be programmed so download/copy logic chip 15 is responsive to the actuation of one or more buttons 33 for setting the device to be a master or a slave. A visual indication of "Master" or "Slave" can be provided on display screen 33. A signal can also be sent to download/copy logic chip 15 to initiate the transfer of data to or from flash memory chip 13 when another one of the buttons 33 is pressed. A visual indication such as "Transfer in Progress" may be provided on display screen 35, thereby obviating the need for LED 25. Display screen 35 can be a liquid crystal display (LCD), a plasma screen or the like.

Figure 7:
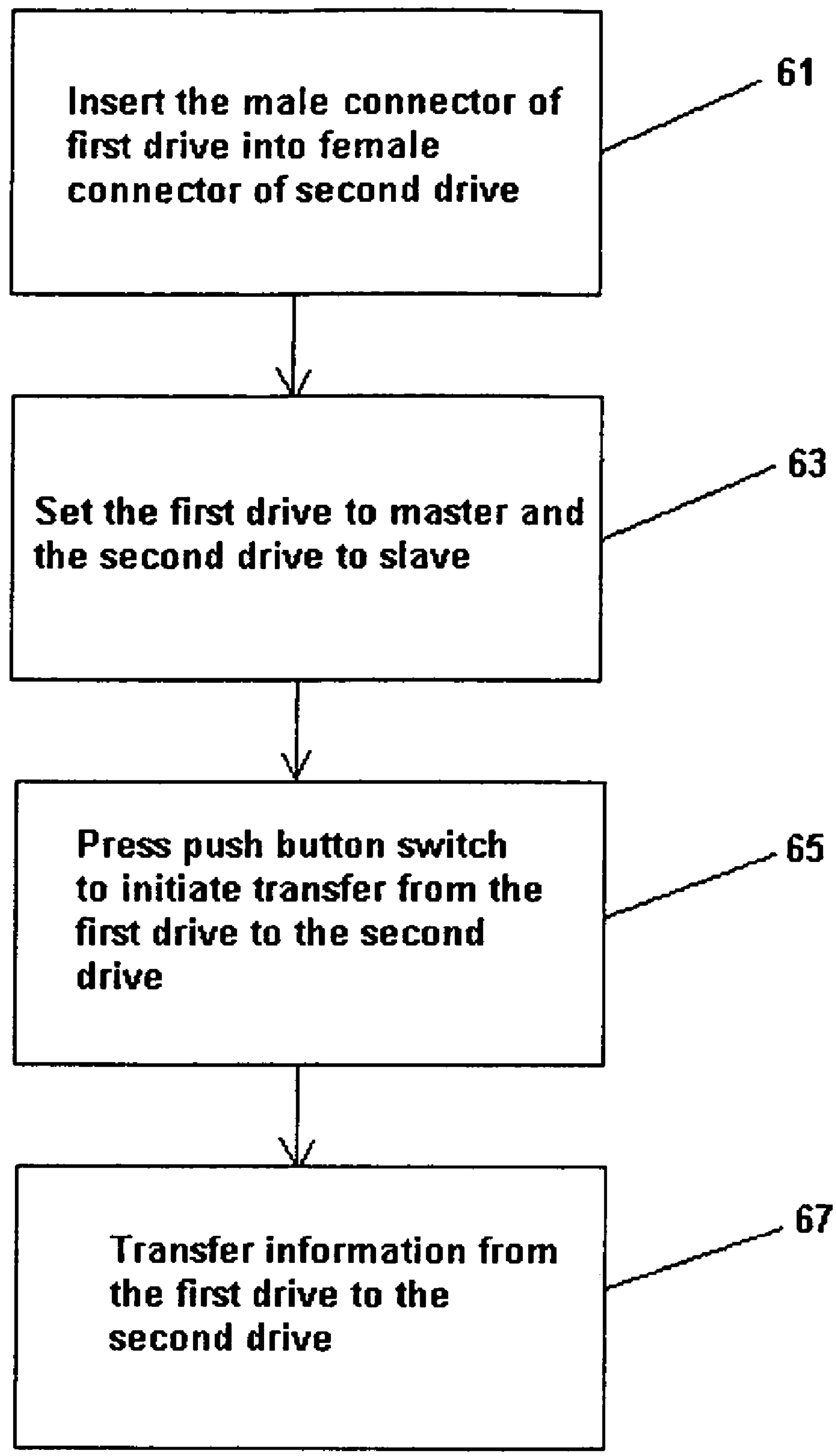
FIG. 7 is flow-diagram of a method of transferring information between two flash memory drives.

With reference to FIG. 7, the present invention is also a method for transferring data to or from the flash memory chip of a flash memory drive with integrated male and female connectors. The method begins at step 61 by inserting the male connector of a first flash memory drive into the female connector of a second flash memory drive. Next, at step 63, the first drive is set to master and the second drive is set to slave using each of the drive's master/slave switches. Then, at step 65, the push button switch is activated to initiate the transfer of data from the flash memory chip of the first flash memory drive to the flash memory chip of the second flash memory drive. Finally, at step 67, the data is transferred from the flash memory chip of the first drive to the flash memory chip of the second drive. The preceding method is illustrative of the transfer of data between two flash memory drives in accordance with the present invention and is not to be construed as limiting the invention. The transfer of data between a flash memory drive in accordance with the present invention and prior art flash memory drives, computers, palm devices, laptops, and the like is also envisioned. For example, when the male connector of a prior art flash memory drive is inserted into the female connector of a flash memory drive in accordance with the present invention, the master/slave switch of the flash memory drive in accordance with the present invention is set to master for transferring data from the flash memory chip of flash memory drive in accordance with the present invention to the flash memory chip of the prior art flash memory drive. A further example is when the male connector of a flash memory drive in accordance with the present invention is inserted into the female connector of a computer, palm device and the like, the transfer of data to or from the flash memory chip of the flash memory drive in accordance with the present invention can be controlled by the computer, palm device and the like in a manner known in the art.

While the present invention was described with reference to preferred embodiments of the flash memory drive with integrated male and female connectors, those skilled in the art may make modifications and alterations to the present invention without departing from the scope and spirit of the invention. Accordingly, the above detailed description is intended to be illustrative rather than restrictive. The invention is defined by the appended claims, and all changes to the invention that fall within the meaning and range of equivalency of the claims are to be embraced by their scope.

The invention claimed is:

1. A flash memory drive comprising:

a male USB connector;

a female accessible USB connector;

a flash memory chip operatively coupled to the male connector and the female connector;

means coupled to the flash memory chip for transferring data to and from the flash memory chip via the male connector and the female connector; and an integral electrical power supply coupled to provide operating power to the flash memory chip and the means for transferring data, whereupon when the male connector or the female connector is mated with a mating connector, the means for transferring data powered by the integral electrical power supply is operative for causing the transfer of data to and from the flash memory chip via said mated connectors without the use of a computer.

2. The drive of claim 1, wherein the electrical power supply is a battery.

3. The drive of claim 1, further comprising means for facilitating electrical connection of the female connector and the male connector to a cable, another drive or a peripheral device.

4. The drive of claim 1, further comprising a switch for causing the transfer of data to and from the flash memory chip.

5. The drive of claim 1, further comprising a master/slave switch for setting the drive to transfer data to and from the flash memory chip as a function of the setting of said master/slave switch.

6. The drive of claim 1, further comprising an LED for indicating that the transfer of data is in progress.

7. The drive of claim 1, further comprising an enclosure for housing the flash memory chip, the means for transferring data and the power supply, and for at least partially housing the male connector and the female connector.

8. The drive of claim 7, further comprising:

means for retrieving digital audio data from the flash memory chip;

means for decoding the retrieved digital audio data;

means for converting the decoded digital audio data to an analog signal; and an output connector for outputting the analog signal.

9. The drive of claim 8, further comprising a plurality of buttons accessible via the enclosure for controlling at least one of the means for retrieving, the means for decoding and/or the means for converting.

10. The drive of claim 9, further comprising a display screen viewable via the enclosure for providing a visual indication of information related to the digital audio data.

11. The drive of claim 8, wherein the digital audio data is stored in the flash memory chip in at least one of the MP3 and WMA formats.

12. A flash memory drive comprising:

an enclosure;

a male USB connector at least partially disposed within the enclosure;

a female accessible USB connector at least partially disposed within the enclosure;

a first flash memory chip disposed in the enclosure and operatively coupled to the male connector and the female connector;

means disposed in the enclosure for transferring data to and from the first flash memory chip; and an electrical power source supported by the enclosure and providing operating power to the first flash memory chip and the means for transferring data, wherein:

when the male USB connector or the female USB connector is mated with another female USB connector or another male USB connector, respectively, operatively coupled to a second flash memory chip, data is caused to be transferred to the first flash memory chip from the second flash memory chip, or vice versa, via the mated connectors by the means for transferring data powered by the electrical power source without the use of a computer.

13. The drive of claim 12, wherein the electrical power source is a battery.

14. The drive of claim 12, further comprising a switch for initiating the transfer of data to and from the first flash memory chip.

15. The drive of claim 12, further comprising a master/slave switch for causing data to be transferred to or from the first flash memory chip as a function of the setting of the switch.

16. The drive of claim 12, further comprising means for facilitating electrical connection of the female USB connector and the male USB connector to the other male USB connector and the other female USB connector, respectively, of another device.

* * * * *